United States Patent
Van Dijk et al.

(10) Patent No.: US 6,378,100 B1
(45) Date of Patent: Apr. 23, 2002

(54) METHOD AND APPARATUS FOR ENCODING MULTIWORD INFORMATION WITH ERROR LOCATIVE CLUES DIRECTED TO LOW PROTECTIVITY WORDS

(75) Inventors: Marten E. Van Dijk; Ludovicus M. G. M. Tolhuizen; Constant P. M. J. Baggen, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/218,560

(22) Filed: Dec. 22, 1998

(30) Foreign Application Priority Data

Dec. 29, 1997 (EP) .............................. 97204130
Apr. 15, 1998 (EP) .............................. 98201200

(51) Int. Cl.[7] .............................................. H03M 13/00
(52) U.S. Cl. ......................................... 714/752; 714/701
(58) Field of Search ................................... 714/752, 701, 714/757, 766, 756, 762; 360/40

(56) References Cited

U.S. PATENT DOCUMENTS

| | | | |
|---|---|---|---|
| 4,559,625 A | 12/1985 | Berlekamp et al. | 714/701 |
| 4,730,321 A * | 3/1988 | Machado | 714/756 |
| 4,802,173 A * | 1/1989 | Baggen | 714/701 |
| 5,299,208 A | 3/1994 | Blaum et al. | 714/761 |
| 5,659,557 A * | 8/1997 | Glover et al. | 714/752 |
| 5,691,992 A * | 11/1997 | Molnar et al. | 714/752 |
| 5,771,244 A * | 6/1998 | Reed et al. | 714/752 |
| 5,812,603 A * | 9/1998 | Luthi et al. | 375/287 |

OTHER PUBLICATIONS

Yu–Victor et al. (Decoding for Interactive Reed–Solomon Coding Schemes; IEEE, Apr. 1997).*
High Security Voice Cryptographic Technique For Analog Transmission Systems. IBM Technical Disclosure Bulletin, Feb. 1982, US, p. No.: 4865–4868; NN82024865).*

* cited by examiner

Primary Examiner—Albert Decady
Assistant Examiner—Guy Lamarre
(74) Attorney, Agent, or Firm—Laurie E. Gathman (57) ABSTRACT

Multiword information is encoded as based on multibit symbols in relative contiguity with respect to a medium, whilst providing wordwise interleaving and wordwise error protection code facilities. This may provide error locative clues across words of multiword groups, that originate in high protectivity clue words and point to low protectivity target words. The clue words may have a first uniform size and be interspersed in a first uniform manner. The target words may have a second uniform size and be interspersed in a second uniform manner. The organization may be applied for use with optical storage. Sectors may get provisional protectivity as a low-latency error correction mechanism.

44 Claims, 5 Drawing Sheets

1 sector
Possible sector formats:

METHOD AND APPARATUS FOR ENCODING MULTIWORD INFORMATION WITH ERROR LOCATIVE CLUES DIRECTED TO LOW PROTECTIVITY WORDS

A method for encoding multiword information by wordwise interleaving and error protection, with error locative clues derived from high protectivity words and directed to low protectivity words, a method for decoding such information, a device for encoding and/or decoding such information, and a carrier provided with such information.

BACKGROUND OF THE INVENTION

The invention relates to a method of encoding multibit information in the form of multibit symbols arranged in relative contiguity with respect to a medium, and in particular to such a method which provides wordwise interleaving, wordwise error protection coding, and error locative clues across multiword groups. U.S. Pat. Nos. 4,559,625 to Berlekamp et al and 5,299,208 to Blaum et al disclose the decoding of interleaved and error protected information, wherein an error pattern found in a first word may give a clue to locate errors in another word of the same group of words. Errors pointed at are relatively closer or more contiguous than other symbols of the word that would generate the clue. The references use a standardized format and a fault model with multisymbol error bursts across various words. Occurrence of an error in a particular word gives a strong probability for an error to occur in a symbol position pointed at in a next word or words. The procedure will often raise the number of corrected errors.

The present inventors have recognized a problem with this method: a clue will only materialize when the clue word has been fully corrected. They have recognized a further problem: complete decoding necessitates a whole block, even if only a tiny part thereof were afflicted with errors. Combining this with a mechanically driven carrier will cause an appreciable latency, which for a disc would average about one revolution.

SUMMARY OF THE INVENTION

A object of the present invention to provide a coding format wherein clue words will be correctly decoded with a greater degree of certainty than a target word. Now therefore, according to one of its aspects the invention is characterized by the steps of splitting the multiword information into clue words and target words, providing a high level of error protection to the clue words, and a lower level of protection for said target words, and using detected errors in the clue words to identify locations in the target words having a high likelihood of error. A clue or a combination of clues, once found, symbols which may be unreliable one or more symbols which may be unreliable. With such identifying, such as by characterizing as erasure symbols, error correction will become more powerful. Many codes will correct at most t errors when no error locations are known. Given one or more erasure locations, generally a larger number e>t of erasures may be corrected. Other types of identifying than characterizing as erasure symbols are feasible. Protection against a combination of bursts and random errors will also improve. Alternatively, the providing of erasure locations will need the use of only a lower number of syndrome symbols, thus simplifying the calculation. The invention may be used in a storage environment as well as in a transmission environment.

It is a further object of the invention to diminish the above latency for the rather common situation that the errors are sparse. According to a solution therefor, in a storage device having a plurality of sectors in a revolution latency will often reduce to about a single sector.

The invention also relates to a method for decoding information so encoded, to an encoding and/or decoding device for use with the above method, and to a carrier provided with information for interfacing to such encoding and/or decoding.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
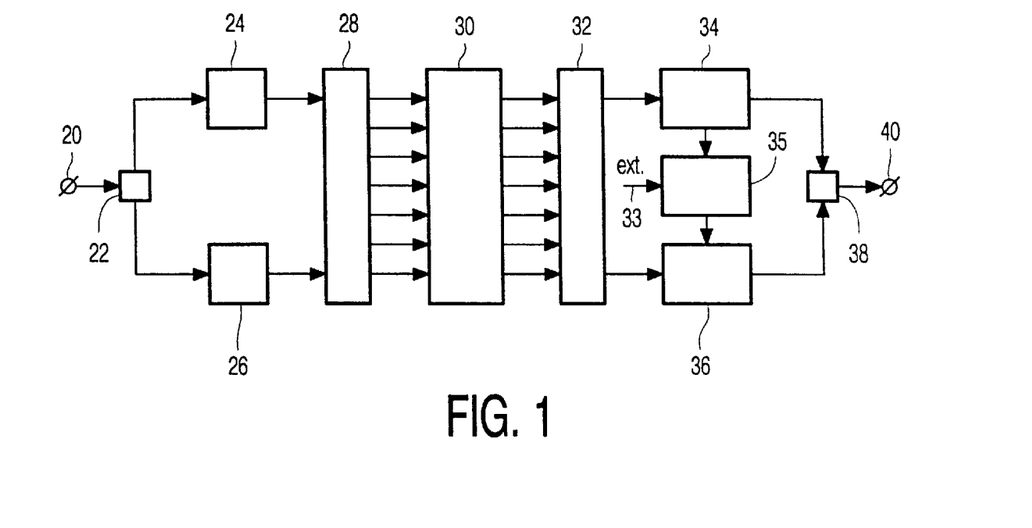
FIG. 1, a system with encoder, carrier, and decoder.
Figure 2:
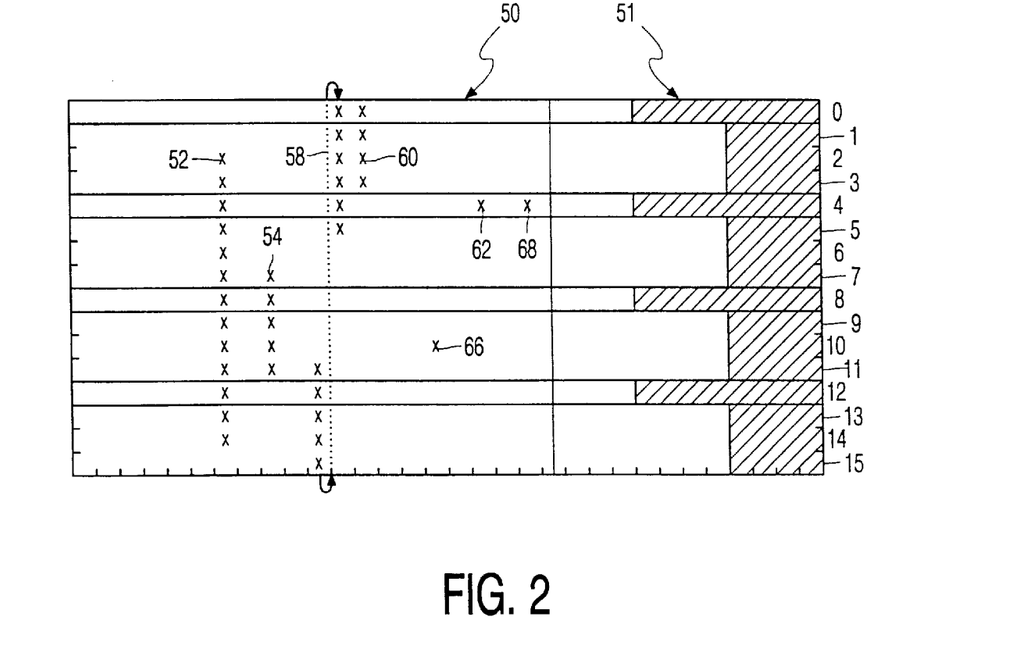
FIG. 2, a code format principle.

FIG. 1 shows a comprehensive system according to the invention, provided with encoder, carrier, and decoder. The embodiment is used for encoding, storing, and finally decoding a sequence of multibit symbols derived from an audio or video signal, or from data. Terminal 20 receives successive symbols that by way of example have an eight bit size. Splitter 22 recurrently and cyclically transfers symbols intended for the clue words to encoder 24, and all other symbols to encoder 26. In encoder 24 the clue words are formed by encoding the data into code words of a first multi-symbol error correcting code. This code may be a Reed-Solomon code, a product code, an interleaved code, or a combination thereof. In encoder 26 the target words are formed by encoding into code words of a second multi-symbol error correcting code. In this embodiment, all code words will have a uniform length, but this is not necessary. Preferably, both codes will be Reed-Solomon codes with the first one a subcode of the second code. As shown in FIG. 2, the clue words have a higher degree of error protection. Furthermore, in a carrier having a plurality of sectors per revolution each sector may get an additional amount of provisional protectivity to be discussed hereinafter.

In box 28, the code words are transferred to one or more outputs of which an arbitrary number has been indicated, so that the distribution on a medium to be discussed later will become uniform. Box 30 symbolizes the unitary medium itself such as tape or disc that receives the encoded data. This may imply direct writing in a write-mechanism-plus-medium combination. Alternatively, the medium may be realized as a copy from a master encoded medium such as a stamp. In box 32, the various words are read again from the medium. Then the clue words of the first code will be sent to decoder 34, and decoded as based on their inherent redundancies. Furthermore, as will become apparent in the discussion of FIG. 2 hereinafter, such decoding may present clues on the locations of errors in other than these clue words. Box 35 receives these clues and as the case may be, other indications on arrow 33, and operates on the basis of a stored program for using one or more different strategies to translate clues into erasure locations or other indications for identifying unreliable symbols. The target words are decoded in decoder 36. With help from such erasure locations or other identifications, the error protection of the target words is raised to a higher level. Finally, all decoded words are demultiplexed by means of element 38 conformingly to the original format to output 40. For brevity, the mechanical interfacing of the various subsystems has been omitted.

FIG. 2 shows a relatively simple code format illustrative of the inventive principle. As shown, the coded information has been notionally arranged in a block of 16 rows and 32 columns of symbols, that is 512 symbols. Storage on a medium is serially column-by-column starting at the top left column. The hatched region contains check symbols, and clue words 0, 4, 8, and 12 have 8 check symbols each. The other words contain 4 check symbols each and constitute target words. The whole block contains 432 information symbols and 80 check symbols. The latter may be localized in a more distributed manner over their respective words. A part of the information symbols may be dummy symbols. The Reed-Solomon code allows to correct in each clue word up to four symbol errors. Actual symbol errors have been indicated by crosses. In consequence, all clue words may be decoded correctly, inasmuch as they never have more than four errors. Notably words 2 and 3 may however not be decoded on the basis of their own redundant symbols only. Now, in FIG. 2 all errors, except 62, 66, 68 represent error strings. However, only strings 52 and 58 that cross at least three consecutive clue words are considered as error bursts, and cause erasure flags in all intermediate symbol locations. Also, one or more target words before the first clue word error of the burst and one or more target words just after the last clue symbol of the burst may get an erasure flag, depending on the strategy followed. String 54 is not considered a burst, because it is too short.

Therefore, two of the errors in word 4 produce an erasure flag in the associated columns. This renders words 2 and 3 correctable, each with a single error symbol and two erasure symbols. However, neither random errors 62, 68, nor string 54 constitute clues for words 5, 6, 7, because each of them contains only a single clue word. In certain situations, an erasure may result in a zero error pattern, because an arbitrary error in an 8-bit symbol has a $1/256$ probability to cause again a correct symbol. Likewise, a burst crossing a particular clue word may produce a correct symbol therein. A bridging strategy between preceding and succeeding clue symbols of the same burst will incorporate this correct symbol into the burst, and in the same manner as erroneous clue symbols may translate it into erasure values for appropriate target symbols.

DISCUSSION OF A PRACTICAL FORMAT

Figure 3:
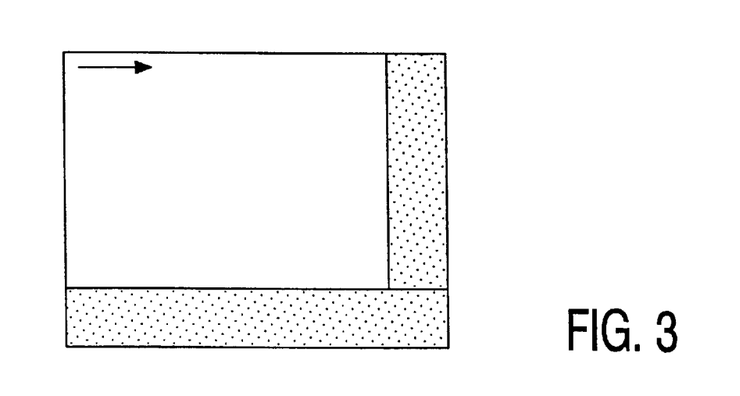
FIG. 3, a product code format.
Figure 4:
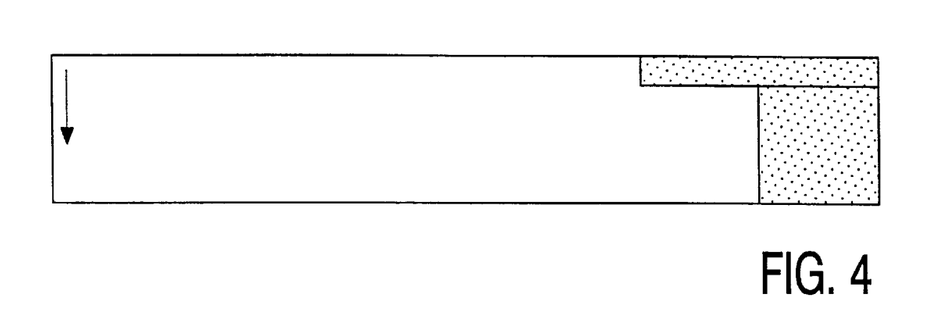
FIG. 4, a Long Distance Code with burst detection.

Hereinafter, a practical format will be discussed. FIG. 3 symbolizes a product code format. Words are horizontal and vertical, and parity has been hatched. FIG. 4 symbolizes a so-called Long Distance Code with special burst detection in a few upper words that have more parity. The invention also may be used with a so-called Picket Code that may be constructed as a combination of the principles of FIGS. 3 and 4. Always, writing is sequential along the arrows shown in FIGS. 3, 4.

Practicing the invention is governed by newer methods for digital optical storage. In particular, for substrate incident reading the upper transmissive layer may be as thin as 100 micron. The channel bits have a size of some 0.14 microns, and a data byte at a channel rate of $2/3$ will have a length of only 1.7 microns. At the top surface the beam has a diameter of some 125 microns. A caddy or envelope for the disc reduces the probability of large bursts. However, non-conforming particles of less than 50 microns may cause short faults. The inventors have inter alia used a fault model wherein such faults through error propagation may lead to bursts of 200 microns, corresponding to some 120 Bytes. The fault model proposes fixed size bursts of 120 B that start randomly with a probability per byte of $2.6*10^{-5}$, or on the average one burst per 32 kB block. The invention has been conceived for serial storage on optical disc, but configurations such as multitrack tape, and other technologies such as magnetic and magneto-optical would also benefit from the improved approach herein.

Figure 5:
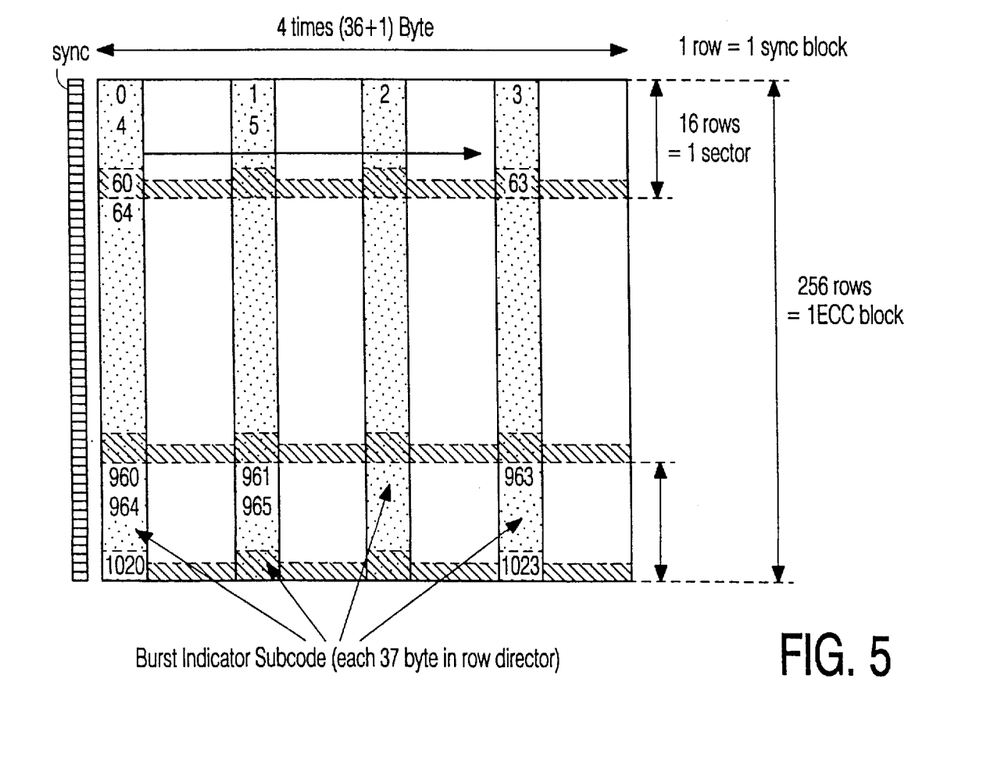
FIG. 5, a picket code and burst indicator subcode.

FIG. 5 shows a picket code and burst indicator subcode. A picket code consists of two subcodes A and B. The burst indicator subcode (BIS) contains the clue words. It is formatted as a very deeply interleaved long distance code that allows to localize the positions of the multiple burst errors. The error patterns so found are processed to obtain erasure information for the target words that are configured in the embodiment as a product subcode (PS). The product subcode will correct combinations of multiple bursts and random errors, by using erasure flags obtained from the burst indicator subcode.

The following format is proposed:
the block of '32 kB' contains 16 DVD-compatible sectors
each such sector contains 2064=2048+16 Bytes data
each sector after ECC encoding contains 2368 Bytes
therefore, the coding rate is 0.872
in the block, 256 sync blocks are formatted as follows
each sector contains 16 sync blocks
each sync block consists of 4 groups of 37 B
each group of 37 B contains 1 B of deeply interleaved Burst Indicator Subcode and 36 B of Product Subcode.

In FIG. 5, rows are read sequentially, starting with the preceding sync pattern. Each row contains 4 Bytes of the BIS shown in grey, numbered consecutively, and spaced by 36 other Bytes. Sixteen rows form one sector and 256 rows form one sync block. Overall redundancy has been hatched. Also the synchronization bytes may also be used to yield clues, through redundancy therein that is outside the main code facilities. The same hardware arrangement of FIG. 1 may execute the processing of the synchronization bytes that now constitute words of different format than the data bytes in a preliminary operation step. Still further information may indicate certain words or symbols as unreliable, such as through the quality of the signal derived from the disc, through demodulation errors, and others.

Figure 6:
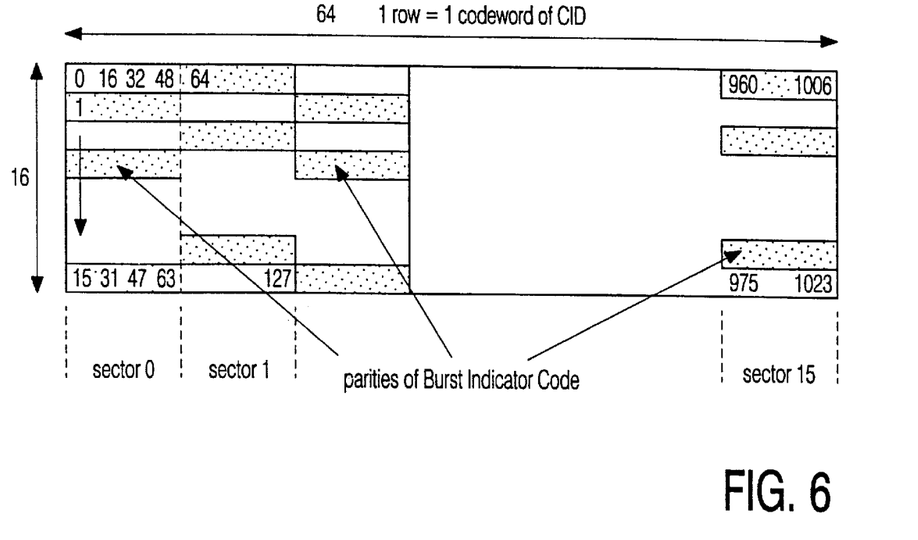
FIG. 6, a burst indicator subcode format.

FIG. 6 shows exclusively a burst indicator subcode format of the same 64 numbered Bytes per sector of FIG. 5, and is constructed as follows:
there are 16 rows, with each a [64,32,33] RS code with t=16;
sequential columns derive from disk as shown by the arrow, and groups of four columns derive from a single sector for fast addressing;

BIS may indicate at least 16 bursts of 592 B (~1 mm) each;

BIS contains 32 Bytes data per sector: 4 columns of the BIS, and in particular 16 Bytes DVD header, 5 Bytes parity on the header to allow fast address readout, and 11 Bytes user data.

Figure 7:
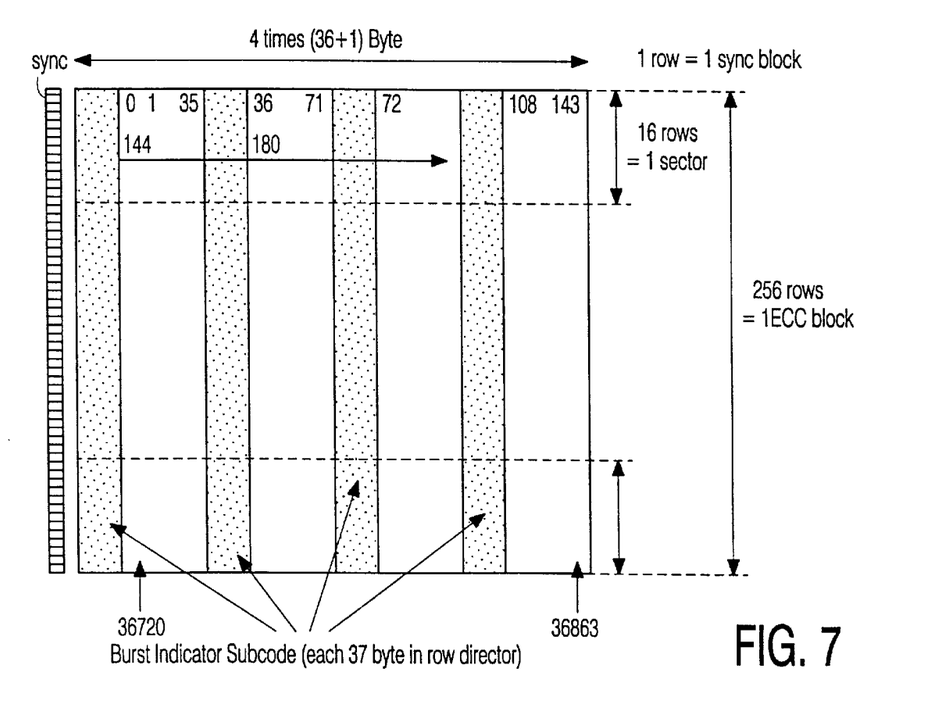
FIG. 7, a picket code and its product subcode.

FIG. 7 shows a Picket Code and its Product Subcode that is built from the target words. The Bytes of the Product Subcode are numbered in the order as they are read from the disc, whilst ignoring the BIS bytes.

Figure 8:
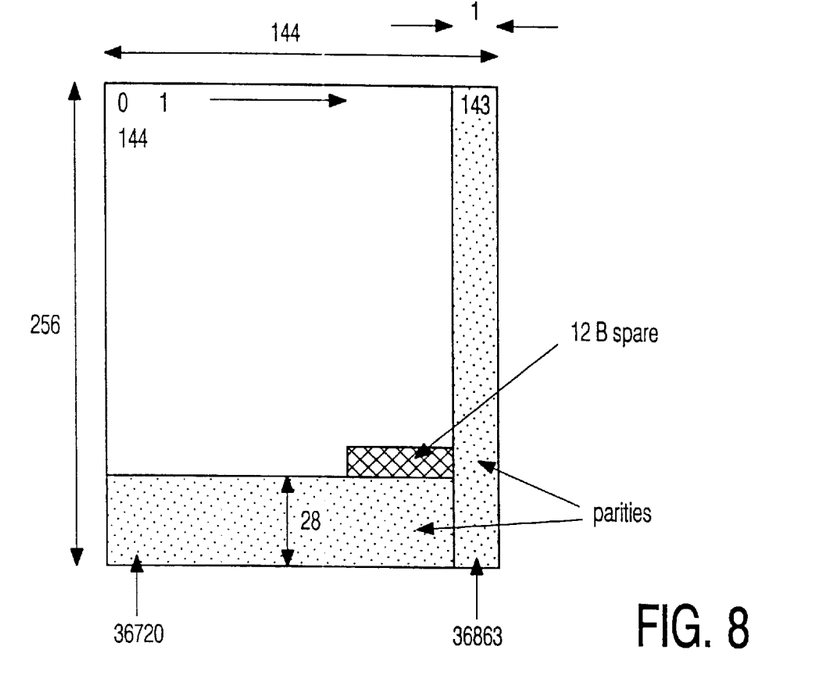
FIG. 8, various further aspects thereof.

FIG. 8 shows further aspects of the product subcode, which is a [256,228,29]*[144,143,2] Product Code of Reed-Solomon codes. The number of data Bytes is 228*143= 32604, that is 16*(2048+11) user Bytes plus 12 spare Bytes.

Figure 9:
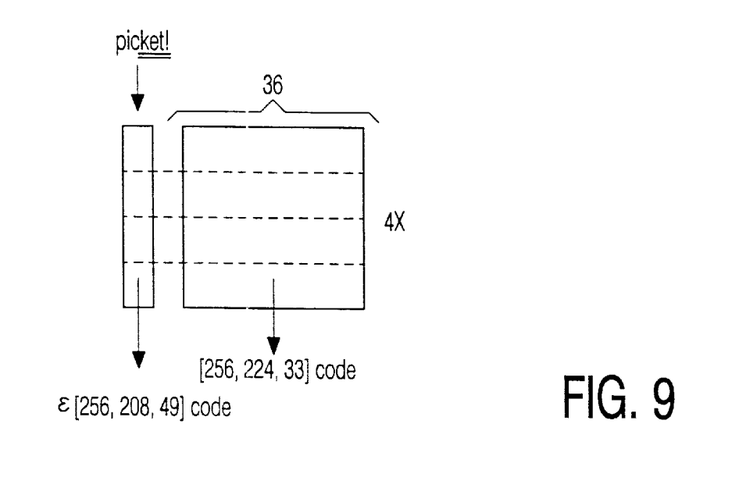
FIG. 9, an alternative format.

FIG. 9 as an alternative to FIG. 8 omits the horizontal Reed-Solomon code; the format shown is repeated four times in horizontal direction. The horizontal block is 36 Bytes (one quarter of FIG. 7), and uses a [256,224,33] Reed-Solomon code. Each sector has 2368 Bytes. No dummy Bytes are present.

The code in the first column is formed in two steps. From each sector, the 16 header Bytes are first encoded in a [20,16,5] code to allow fast address retrieving.

The resulting 20 Bytes plus a further 32 user Bytes per sector form data bytes and are collectively encoded further. The data symbols of one 2 K sector may lie in only one physical sector, as follows. Each column of the [256,224,33] code contains 8 parity symbols per 2 K sector. Further, each [256,208,49] code has 12 parity symbols per 2 K sector and 4 parity symbols of the [20,16,5] code to get a [256,208,49] code with 48 redundant bytes.

Figure 10:
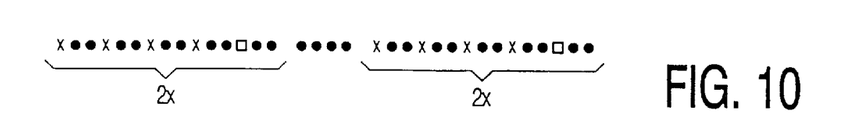
FIG. 10, a detail on the interleaving.

FIG. 10 shows this interleaving in detail. Here, '*' represents the header Bytes, '□' the parities of the [20,16] code, '●' the 32 "further" data Bytes and 12 parity Bytes for the [256,208] code.

Figure 11:
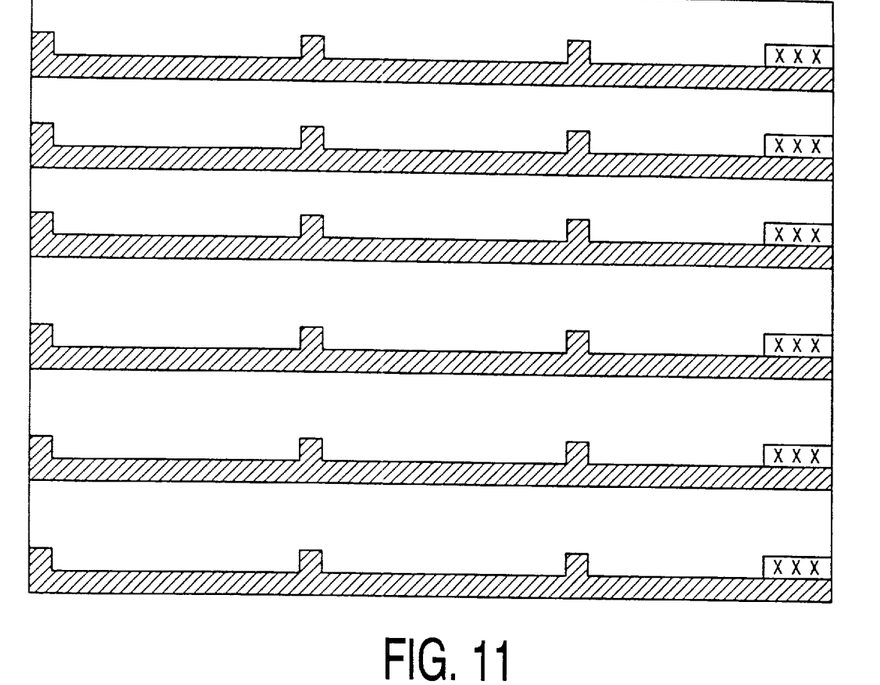
FIG. 11, the location of local redundancy.

FIG. 11 shows the relative positions of the local redundancy just as in FIG. 5, but with only three horizontal periods. At the far right, crosses give the positions of the local redundancy. The hatched redundancy will only be useful when all sectors will have been read.

Figure 12:
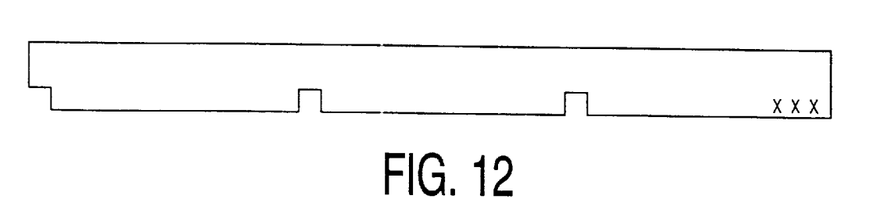
FIG. 12, the protectivity by local redundancy.

FIG. 12 shows the protectivity of the local redundancy, with the hatched part of FIG. 11 removed. The scope of the local protectivity is just one sector, minus the redundancy of the main error protective code facilities. The provisional protectivity is thus outside the main code facilities.

Figure 13:
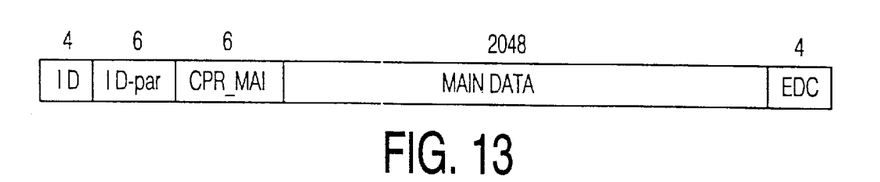
FIGS. 13, 14, possible sector formats.
Figure 14:
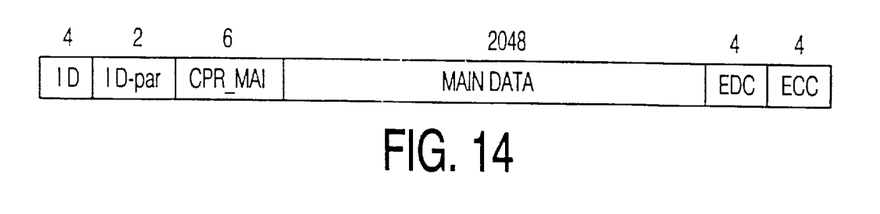

FIGS. 13, 14 show two possible formats for a 2068 Byte sector, corresponding to FIG. 12. In FIG. 13, the various fields contain successively: a four Byte identifier, six parity Bytes exclusively for the identifier, six bytes CPR_MAI (CoPyRight MAnagement Information), 2048 Bytes Main Data, and an error detection field of four Bytes, such as a cyclic redundancy code CRC field. Here, the identifier is protected relatively heavily. In FIG. 14, the protection of the identifier is reduced to 2 bytes. The remainder forms an extra single burst error correcting code over the sector: this can correct a burst of up to 16 bits that is located in an arbitrary bit column.

Various further inventive aspects are as follows:

The local code is a so-called subspace subcode. Such code is formed by first defining a multisymbol code with the symbols of a code word in a finite field. Next, the code is limited to words that have a prescribed uniform partial pattern in all their non-redundant symbols, such as "00" in the two least significant bit positions. This part, although taken into consideration for purposes of processing, need not be stored then, inasmuch as it does not contain user information. In fact, the code words will now apparently be based on shorter symbols. However, without further consideration the redundant symbols may have different patterns than "00" on these bit positions, so their lengths may not be reduced. The solution is then to reserve a number of user symbol positions for pseudo-information that renders a sufficient number (here at least two) of predetermined bit positions in the redundant symbols equal to zero. Suppressing these zeros and rearranging all other bits on the positions corresponding to the shorter symbol length will fix the redundant symbols in the shorter format. The skilled art practitioner will know how to use other content and other location for the above partial pattern. It may be necessary to suppress a few non-redundant symbols, if the code word length was near its theoretical boundary.

The local code is a bit burst correcting code. Four symbols may in general be used to correct a sixteen bit burst. Another bit burst correcting code is the known FIRE-code. Alternatively, the local code allows to correct a quaternary burst that is made up from bit pairs. The local code may be used as a provisional protectivity to start decoding. In case of failure, the local code is foregone, and the main code is used to correct major error patterns. Subsequent to the decoding of the main code, a few errors may subside. Then, the local code may be called upon again, as a third layer of code.

What is claimed is:

1. A method of encoding multiword information, wherein said method includes encoding said information as multibit symbols in relative contiguity with respect to a medium, with wordwise interleaving and wordwise error protection coding, and provides error locative clues across multiword groups, characterized in that the method comprises:

splitting said multiword information into clue words and target words, providing a high level of error protection coding for said clue words, and a lower level of protection coding for said target words, and using detected errors in said clue words to identify target word portions having a high likelihood of errors.

2. A method as claimed in claim 1, characterized in that the encoded clue words have a first uniform size and are interspersed in a first uniform manner with respect to encoded target words, and said encoded target words have a second uniform size and are interspersed in a second uniform manner.

3. A method as claimed in claim 1, characterized in that said medium is an optical medium, and the encoded clue words and encoded target words are stored in said medium.

4. A method as claimed in claim 1, wherein said multiword information is encoded in a block divided into sectors, characterized in that said sectors each have their own respective header and are sequentially presented to said medium.

5. A method as claimed in claim 4, characterized in that in addition to said wordwise interleaving and wordwise error protecton coding, said blocks further contain additional error protection.

6. A method as claimed in claim 5, characterized in that said additional error protection comprises provisional protection through a low-latency error correction mechanism.

7. A method as claimed in claim 6, characterized in that said provisional protection comprises having another symbol alphabet other than said symbols.

8. A method as claimed in claim 6, characterized in that said provisional protection includes a subspace subcode.

9. A method as claimed in claim 6, characterized in that said provisional protection includes-burst error correcting.

10. A method of decoding encoded multiword information, wherein said encoded multiword information is received as multibit symbols in relative contiguity with respect to a medium, with wordwise interleaving and wordwise error protection coding, and with error locative clues across multiword groups, and wherein the method comprises wordwise de-interleaved and decoding of the wordwise error protection coding, and evaluating the error locative clues, characterized in that the multibit information includes encoded clue words having a high level of error protection coding, and encoded target words having a lower level of protection coding, and the evaluating step comprises:

deriving error locative clues from the encoded clue words, and using the error locative clues to identify encoded target word portions having a high likelihood of errors.

11. A method as claimed in claim 10, characterized in that sthe clue words have a first uniform size and are interspersed in a first uniform manner with respect to encoded target words, and said encoded target words have a second uniform size and are interspersed in a second uniform manner.

12. A method as claimed in claim 10, characterized in that corrected symbols in clue words provide respective clues, and successive respective clues in a series of received multibit information collectively yield at least one of:

a) erasure flags for physically intermediate symbols, or b) at least one externally adjacent symbol of target words.

13. A method as claimed in claim 12, further comprising assigning a notional clue to an intermediate unaltered clue word symbol within such series.

14. A method as claimed in claim 10, wherein the multiword information is encoded in a block divided into sectors, characterized in that said sectors each have their own respective header information and are sequentially presented in said medium, and in addition to said wordwise interleaving and wordwise error protection coding, said blocks further contain additional error protection.

15. A method as claimed in claim 14, further comprising evaluating error protection per sector on synchronization information having further redundance in addition to said wordwise interleaving and wordwise error protection coding.

16. A method as claimed in claim 15, characterized by additionally evaluating, in a sector, provisional protection provided as a low-latency error correction mechanism, and reverting to wordwise decoding exclusively in response to failure of said provisional protection.

17. A method as claimed in claim 16, characterized in that said provisional protection comprises having another symbol alphabet other than said symbols.

18. A method as claimed in claim 16, characterized in that said provisional protection includes a subspace subcode.

19. A method as claimed in claim 16, characterized in that said provisional protection includes burst error correcting.

20. A device for encoding multiword information in the form of multibit symbols in relative contiguity with respect to a medium, comprising means for wordwise interleaving within a block, coding means for wordwise error protection code facilities, and assign means for providing error locative clues across words of a multiword group, characterized in that the assign means comprises:

means for splitting said multiword information into clue words and target words, means for providing a high level of error protection coding for said clue words, and a lower level of protection coding for said target words, and means for providing clues in said encoded clue words to identify target word portions having a high likelihood of errors.

21. A device as claimed in claim 20, characterized in that said means for wordwise interleaving interleave encoded clue words at a first uniform size interspersed in a first uniform manner with respect to encoded target words, and said encoded target words are formed in a second uniform size and interspersed in a second uniform manner.

22. A device as claimed in claim 20, wherein said multiword information is encoded in a block divided into sectors, characterized in that each block contains respective error protection code facilities and further contains additional error protection outside said code facilities, and said sectors each have their own respective header information and are sequentially presented to said medium.

23. A device as claimed in claim 22, characterized by providing for each sector respective additional error protection to synchronization information soutside said code facilities.

24. A device as claimed in claim 20, further comprising distributing means for dividing each block into physical sectors and for providing each sector with provisional protection through a low-latency error correction mechanism.

25. A device as claimed in claim 24, characterized in that said provisional protectionis outside said protection code facilities.

26. A device as claimed in claim 24, characterized in that said provisional protection comprises having a code alphabet different from said symbols.

27. A method as claimed in claim 24, characterized in that said provisional protection includes a subspace subcode.

28. A method as claimed in claim 24, characterized in that said provisional protection includes burst error correcting.

29. A device for decoding received multiword information in the form of multibit symbols in relative contiguity within stored blocks with respect to a medium; comprising de-interleave means for effecting wordwise de-interleaving within a received block of information, decoding means for decoding wordwise error protection coding, and evaluating means for evaluating error locative clues across multiword groups, characterized in that the evaluating means derives clues from high level of protection clue words to identify target word portions having a high likelihood of errors.

30. A device as claimed in claim 29, characterized in that said de-interleave means wordwise de-interleaves interleaved encoded clue words at a first uniform size interspersed in a first uniform manner with respect to encoded target words which are interspersed in a second uniform manner with encoded target words formed in a second uniform size.

31. A device as claimed in claim 29, arranged for receiving multiple respective sectors from a received block, and comprising means for correcting errors through at least one source outside said wordwise error protection coding, said sources including:

a) a header, and b) synchronization information redundance outside said wordwise error protection coding.

32. A device as claimed in claim 29, further comprising assessing means for assessing respective physical sectors from each block, and initially evaluating each sector with respect to provisional protection through a low-latency error correction mechanism, and responsive to failure of such assessing, reverting to wordwise decoding exclusively.

33. A device as claimed in claim 32, characterized in that said provisional protection is applicable to a single physical sector.

34. A device as claimed in claim 32 characterized in that said assessing means evaluates the provisional protection independent of said wordwise protection coding.

35. A device as claimed in claim 32, characterized in that said assessing means assesses a code alphabet different from said symbols.

36. A device as claimed in claim 32, characterized in that said provisional protection includes a subspace subcode.

37. A physical carrier for multiword information, produced by encoding said information as multibit symbols in relative contiguity with respect to a medium of the carrier, comprising an array of wordwise interleaved and wordwise error protection coded clue words and target words, said clue words being encoded with a high level of error protection coding, and said target words being encoded with a lower level of protection coding than said clue words.

38. A carrier as claimed in claim 37, characterized in that said clue words have a first uniform size and are interspersed in a first uniform manner with respect to said target words, and said target words have a second uniform size and are interspersed in a second uniform manner.

39. A carrier as claimed in claim 37, characterized in that said medium is an optical storage medium arranged for substrate incident reading.

40. A carrier as claimed in claim 37, characterized in that said array is arranged within a block of information which contains a plurality of sequentially readable physical sectors that each contain respective header information, and said sectors have error protection in addition to the wordwise error protection coding.

41. A carrier as claimed in claim 37, characterized in that each sector has provisional protection as a low-latency error correction mechanism.

42. A carrier as claimed in claim 41, characterized in that said provisional protectiono is based on an alphabet different from said symbols.

43. A carrier as claimed in claim 41 characterized in that said provisional protection includes a subspace subcode.

44. A carrier as claimed in claim 41 characterized in that said provisional protection includes burst error correcting.

* * * * *